United States Patent [19]

Hawk et al.

[11] Patent Number: 5,075,257

[45] Date of Patent: Dec. 24, 1991

[54] AEROSOL DEPOSITION AND FILM FORMATION OF SILICON

[75] Inventors: Roger M. Hawk, Conway; Kamesh V. Gadepally, Little Rock, both of Ark.

[73] Assignee: The Board of Trustees of the University of Arkansas, Little Rock, Ark.

[21] Appl. No.: 611,428

[22] Filed: Nov. 9, 1990

[51] Int. Cl.$^5$ ............................... H01L 21/302
[52] U.S. Cl. ........................ 437/225; 437/233; 437/973; 437/967; 427/13; 427/25
[58] Field of Search .............. 427/13, 25, 27, 30, 427/34, 35, 39; 437/233, 247, 966, 967, 973, 225

[56] References Cited

U.S. PATENT DOCUMENTS

| | | | |
|---|---|---|---|
| 4,233,338 | 11/1980 | Ricard et al. | 437/233 |
| 4,332,838 | 6/1982 | Wegrzyn | 437/4 |
| 4,357,200 | 11/1982 | Grabmaier | 427/74 |
| 4,440,800 | 4/1984 | Morton et al. | 427/13 |
| 4,449,286 | 5/1984 | Dahlberg | 427/34 |
| 4,615,903 | 10/1986 | Miller | 427/27 |

*Primary Examiner*—Brian E. Hearn
*Assistant Examiner*—Trung Dang
*Attorney, Agent, or Firm*—Hermann, Ivester, Hill, Van Santen, Steadman & Simpson

[57] ABSTRACT

A novel method for the deposition of silicon and the formation of silicon films. More specifically, the process provides an aerosol generating technique, wherein silicon powder of optimum particle size is aerosolized, charged, and then electrostatically deposited onto high melting point substrates, which may include semiconducting, insulating, and conducting materials such as silicon, sapphire, and molybdenum, respectively. The powder coated substrates are subsequently heat treated at optimum times and temperatures, resulting in the formation of polycrystalline silicon films.

22 Claims, 8 Drawing Sheets

AIR SUPPLY

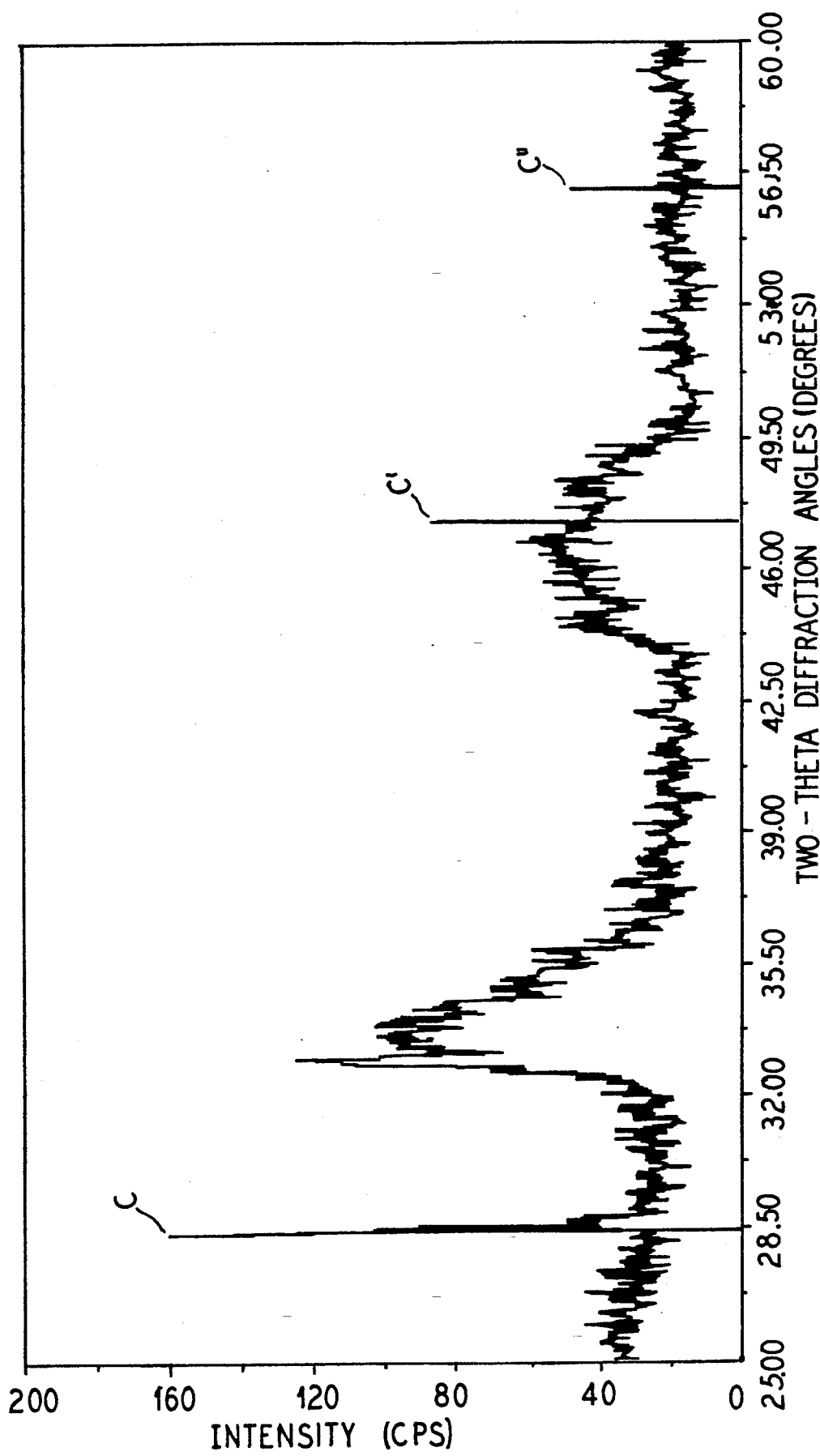

AEROSOL DEPOSITION AND FILM FORMATION OF SILICON

BACKGROUND OF THE INVENTION

1. Field Of The Invention

The present invention relates to a process for the deposition of silicon and/or the formation of a silicon film on various substrates.

2. The Prior Art

Thin film deposition of silicon onto substrates is of tremendous importance to the integrated circuit industry. In particular, the ability to deposit precise silicon film thickness affects the carrier lifetimes and electrical properties of the film. Current state of the art technology utilizes a variety of methods for the deposition of silicon films. The most prevalent include chemical vapor deposition (CVD), sputtering, and molecular beam epitaxy.

Chemical vapor deposition is a gas reaction process in which semiconductive layers are formed by the heat-induced decomposition of selective gases.

Sputtering, a physical deposition method, involves the striking of a target material by energized ions and the subsequent dislodging and deposition of the target atoms.

Molecular beam epitaxy is a technique which uses an electron beam to evaporate and deposit a film one molecular layer at a time. Although these processes are commonly used, the required equipment for these processes is extremely expensive, thereby increasing the costs of the finished product. Further, existing processes use quite dangerous and environmentally unsafe qases.

Accordingly, a more economical and less dangerous process for the deposition and film formation of silicon could reduce he high costs associated with existing deposition processes and facilitate the development of small scale industries at a minimal cost.

SUMMARY OF THE INVENTION

The present invention provides an aerosol generation technique for the deposition and film formation of silicon on various substrates. To this end, the present invention utilizes a solid phase aerosol deposition method, wherein silicon powder is charged using a cornoa charging gun and electrosatically deposited subsequently onto grounded, high melting point substrates. The coated substrates are subjected to a heat treatment cycle to melt all or part of the powder, wherein polycrystalline silicon film is formed. This method has resulted in successfully forming silicon film on semiconducting, insulating, and conducting substrates, in particular on silicon, sapphire, and molybdenum, respectively.

The present invention has potential widespread application in integrated circuit processing, in he production of solar cells, and in the chemical and metallurgical industries. Powder materials are supplies ready for spraying, thereby eliminating the necessity for expensive equipment which is required by existing deposition processes. Further, powder spray coating of substrates can e easily automated, resulting in increased efficiency over existing technologies.

BRIEF DESCRIPTION OF THE DRAWINGS

FIG. 7C is a graph of the x-ray powder diffraction patterns of silicon deposited on LPCVD silicon nitride. Peaks C, C', and C" represent silicon film formation;

DETAILED DESCRIPTION OF THE PRESENTLY PREFERRED EMBODIMENTS

Figure 1A:
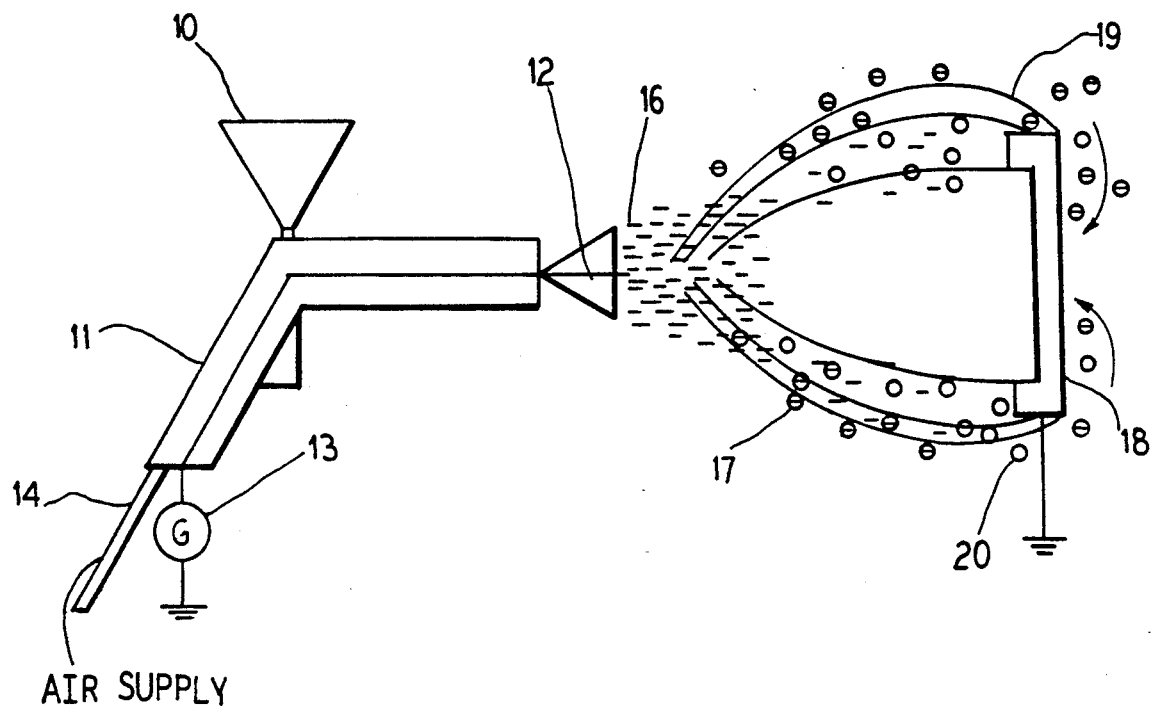
FIG. 1A is a somewhat schematic elevational view of an aerosol generation arrangement used in practicing the steps of the present invention.

The present invention provides a new process for the deposition of silicon and the film formation of silicon on semiconducting, insulating, and conducting substrates. More specifically, the present invention provides a solid phase deposition process, wherein silicon powder is charged using a corona charging gun and then electrostatically deposited onto high melting substrates. These substrates include silicon, sapphire, and molybdenum. The powder coated substrates are subsequently heat treated in a furnace at elevated temperatures to partially or completely melt the powder, thereby forming a polycrystalline silicon film on the respective substrates.

In one embodiment of the present invention, the deposition of silicon powder is controlled by the position of the corona charging gun, the length of the spray time, the velocity of the powder flow, and the electrostatic charge level.

In a preferred embodiment, the velocity of the powder flow is approximately 11.2 $Nm^3/hr$.

In another embodiment, the preferred electrostatic charge level is 75 kV.

In another embodiment, a powder coated substrate is heat treated for approximately 1-24 hours and between the temperatures of approximately 1000° C. and 1430° C. to melt the powder and form silicon film.

In a further embodiment, silicon powder, which is electrostatically deposited onto a substrate by a corona charging gun, has a preferred purity of 99.999% or greater.

As will be shown in the following examples, silicon powder is capable of acquiring charge and responding to an electric field. This property was subsequently used in developing an aerosol method for the deposition of silicon. To this end, an electrostatic powder charging gun wa utilized to deposit uniform silicon powder coatings which adhered well to various substrates. Further, the powder coated substrates were heat treated for specific times and temperatures, resulting in the sintering of the powder and the formation of a polycrystalline silicon film. It is also through this heat treatment process that film thickness can be controlled.

By way of example, and not limitation, the following examples and drawings serve to further illustrate the present invention and its preferred embodiments.

EXAMPLE 1

DEVELOPMENT OF AEROSOL DEPOSITION PROCESS

Preliminary studies focused on the solid phase deposition of silicon powder to obtain a silicon film. A primary objective in developing an aerosol deposition process was to achieve uniform silicon powder coatings which adhered to a substrate and whose thickness could be controlled. Some of the important considerations in generating the aerosols were:

1. To avoid agglomeration;
2. To minimize losses due to deposition on flow tube walls;
3. To minimize contamination;
4. To achieve uniformity of deposition; and
5. To achieve repeatability.

Experiments were initially conducted to characterize the behavior of silicon powder under the influence of an electric field. Accordingly, two electrodes were placed in a transparent plastic tube. A dust feeder, that was connected to a controlled supply of house air, was used to aerosolize the silicon powder. The electrodes were placed approximately 5–6 cm below the inlet of the dust feeder. One electrode was grounded, while the other was positively charged. The potential was initially maintained at 750 volts DC.

The experiments revealed that silicon powder deposited on the electrodes, but not in significant amounts. Most of the deposition occurred at the bottom end of the electrodes because of aerodynamic effects. However, when the DC voltage was increased to 3000 volts, the powder deposited selectively on the positively charged electrode with very little powder deposited on the ground electrode. These results demonstrated that silicon powder was capable of acquiring charge and responding to an electric field at predetermined controlled levels.

After establishing that silicon powder was charging and that an electric field could deflect the powder, silicon powder was introduced into a Ransburg Gema (Model No. 706) electrostatic cup gun.

As illustrated in FIG. 1A, the silicon powder "S" in suitable particulate form is stored in a hopper 10 that is secured to the top of the gun 11. The gun has an electrode 12 located at the front end thereof, which is connected to a high voltage generator 13 via an electrical line passing through the gun body.

A pressurized flowing gas supply 14 is driven through the gun and may comprise compressed dry air which facilitates the transportation and charging of the silicon particles. The powder S is delivered to the gun by gravity and a venturi effect as seen in FIG. 1B.

Figure 1B:
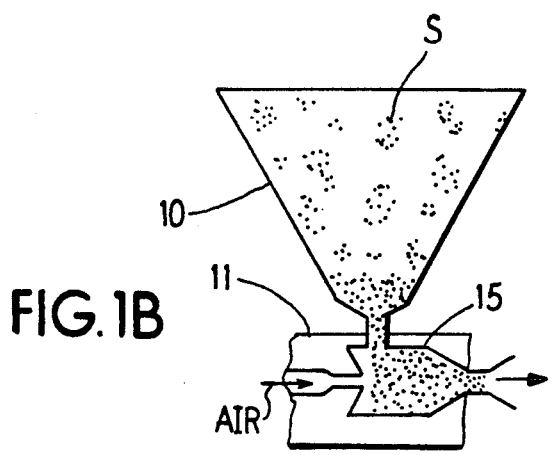
FIG. 1B is an enlarged fragmentary view broken and shown in section to identify additional details of the structure of FIG. 1A.

When the trigger of the gun is actuated, the silicon powder S that is stored in hopper 10 is drawn into the hopper-venturi feeder 15 as depicted in FIG. 1B. The silicon powder S and air supply 14 are mixed together and subsequently flow as a stream into the region of the electrode 12. Within the corona discharge area which extends from the tip of the electrode 12 to a distance outside of the gun, the air ionizes to form free ions 16, thereby causing particles of silicon powder S to acquire an electric charge When the exterior opening of the gun is directed towards a grounded substrate 18, electric field lines 19 form between the tip of the electrode 12, extending from the corona region, to the grounded substrate. The charged silicon particles 17 respond to the electric field lines 19, resulting in the deposition of the particles onto the grounded substrate 18. Although not all of the silicon particles become charged, some uncharged particles 20 are propelled towards the grounded substrate 18, while others are dispersed in the atmosphere.

The volume and velocity of the powder flow are selectively varied by adjusting the gun. The gun had a capacity of 0.8 liters. Typically, the powder flow rate through the electrostatic gun measured 11.2 $Nm^3/h$. Further, it was observed that the thickness of the powder deposition was controlled by the position of the corona charging gun, the length of the spray time, the velocity of the powder flow, and the electrostatic charge level. For example, in one procedure, the position of the corona charging gun was approximately 17 cm from the tip of the gun's electrode to the substrate. The length of the spray time for the deposition of the silicon powder ranged between 1–3 seconds. The preferred velocity of the powder flow was approximately 11.2 $Nm^3hr$. Further, the electrostatic charge level angled between 0 and 100,000 volts DC. However, the preferred electrostatic charge level was determined as 75 kV.

Silicon powder size and purity figured prominently into the development of an aerosol deposition method. Two purities of silicon powder were used in the studies, 99.96%, 99.999%, and 99.999+%. Silicon powder in the −325 mesh range was obtained from CERAC Inc., wherein the count median aerodynamic diameter was 22.5 μm. Powder sizes of less than 5 μm and 99.999+% were obtained from Ethyl Corporation. A portion of the 99.999% purity powder obtained from CERAC Inc. was further ground to a count median aerodynamic diameter of 5.05 μm and a mass median aerodynamic diameter of 11.219 μm. The diameters were measured using an E-SPART analyzer.

Silicon powder sizes used in the aerosol experiments ranged from submicrometers or microclusters up to and including 50 μm. Uniform deposition of silicon powder onto substrates was best achieved with silicon powder ranging in size from 5–48 μm. Occasionally, uniform deposition was achieved with silicon powder size of less than 5 μm with multiple passes of the gun over the substrate. However, clumping of the lesser sized powder was observed under humid laboratory conditions.

Figure 1C:
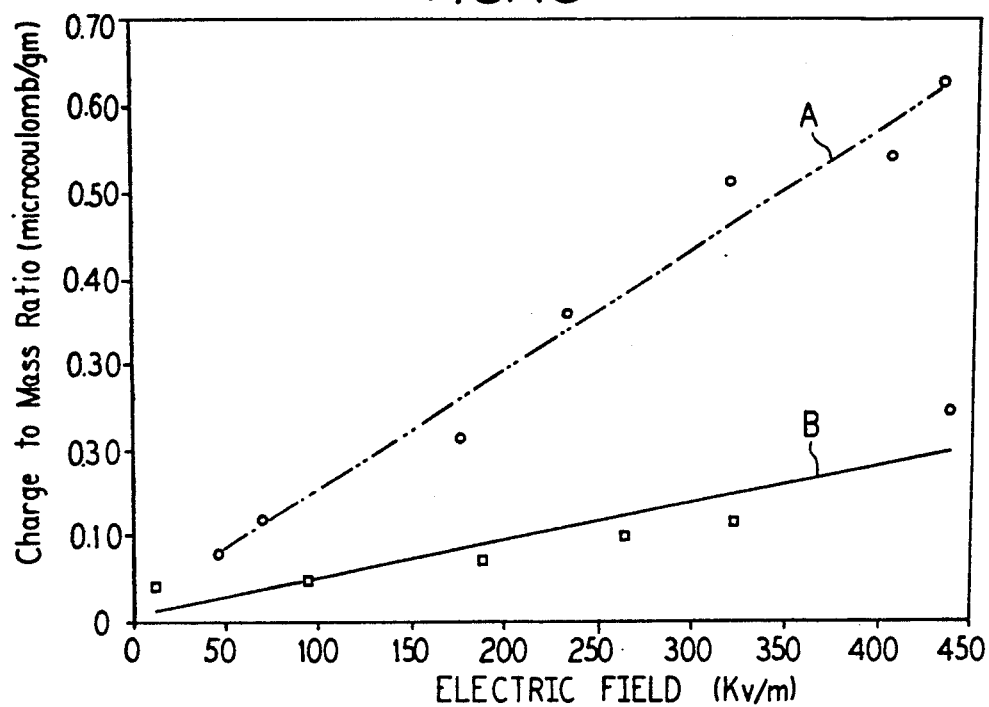
FIGS. 1C, 1D, and 1E are graphs plotting charge to mass ratio versus electric field strength.
Figure 1D:
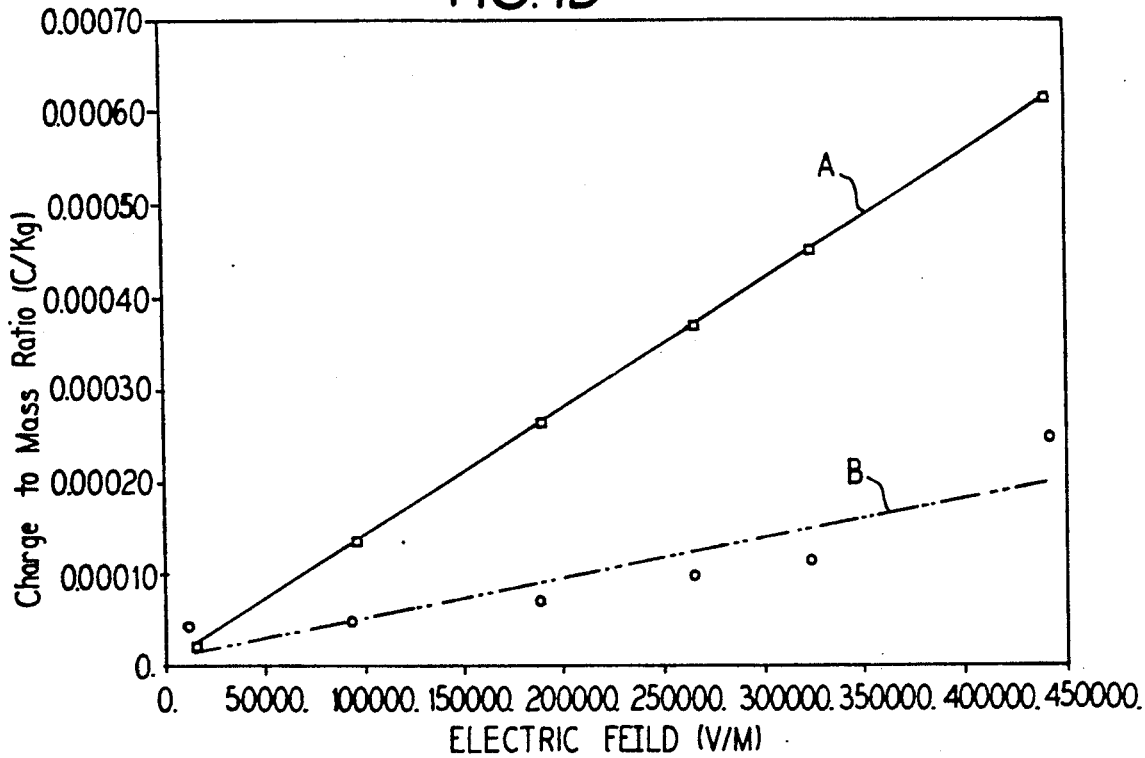
Figure 1E:
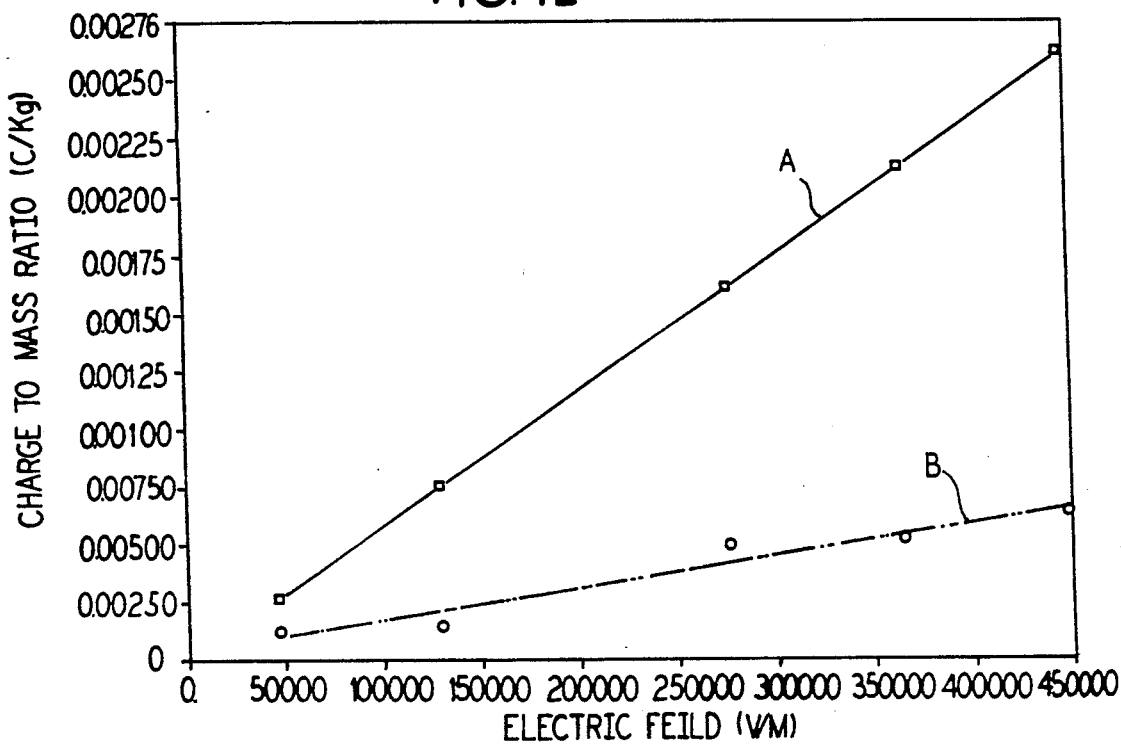
Figure 1F:
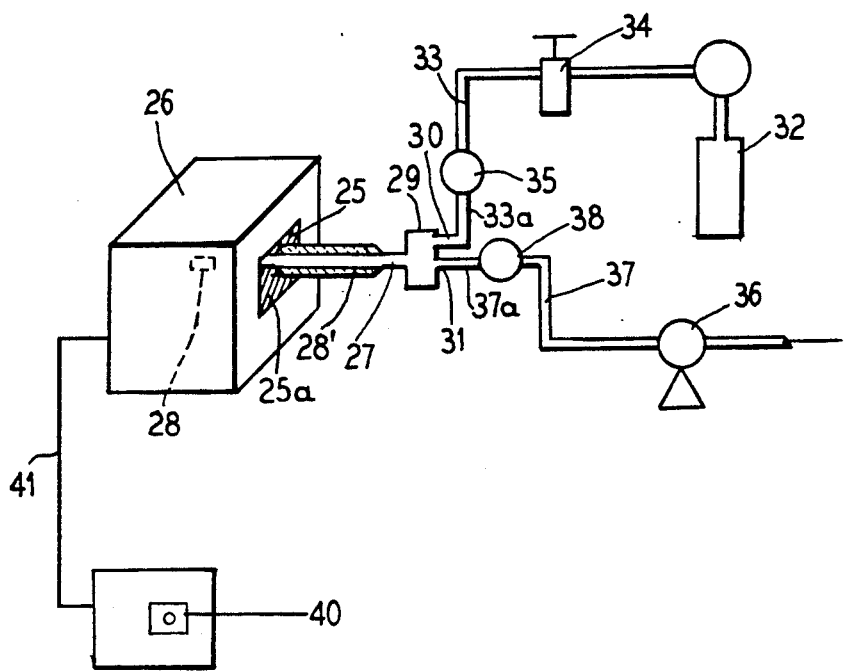
FIG. 1F is schematic view of the heat treatment apparatus.
Figure 2:
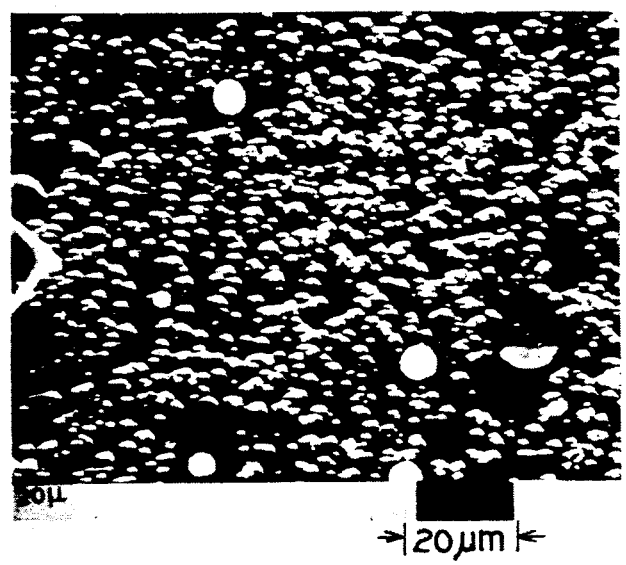
FIG. 2 is a photomicrograph of silicon on sapphire at 1430° C., 12 hours.
Figure 3:
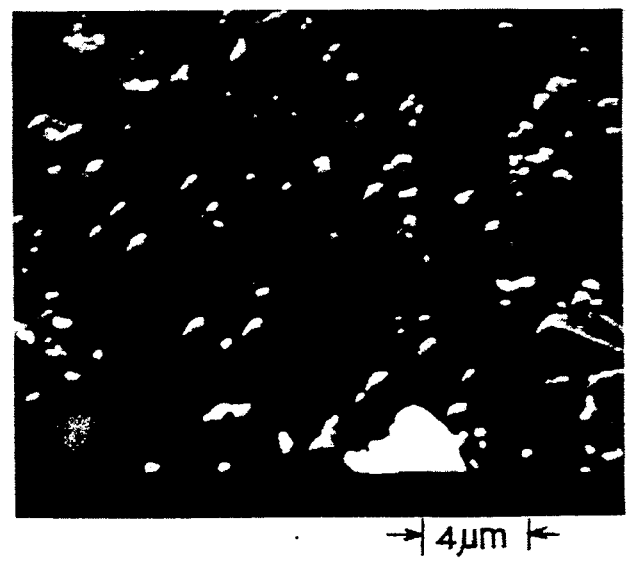
FIG. 3 is a photomicrograph of silicon on sapphire at 1435° C., 12 hours, and ramp down at 1° C./min.
Figure 4:
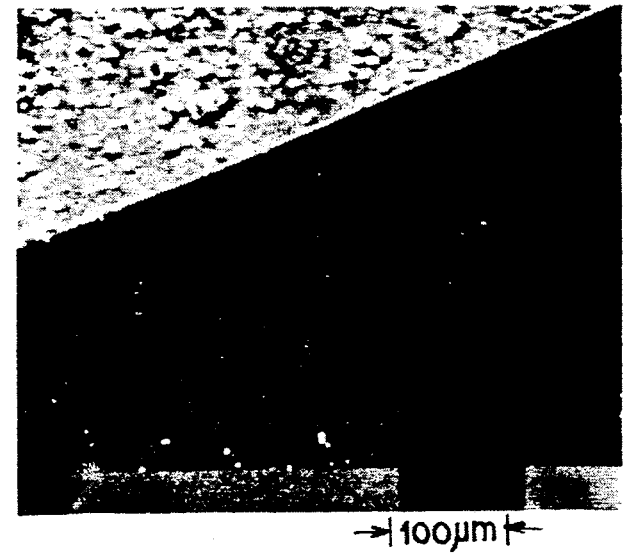
FIG. 4 is a photomicrograph of silicon on sapphire at 1435° C., 12 hours with ramp down at 1° C./min. This edge view illustrates columnar formations.
Figure 5:
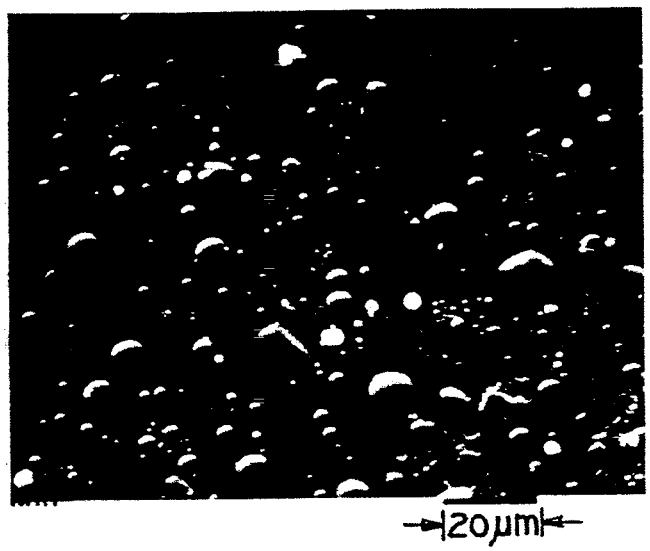
FIG. 5 is a photomicrograph of silicon on sapphire at 1400° C., 24 hours.

As shown in FIG. IC, the higher purity silicon (Plot A) had a greater ability to acquire an electric charge than the lesser pure silicon (Plot B). Consequently, the higher purity silicon interacted with electric field lines at a greater rate, resulting in better deposition of the silicon particles onto a substrate for the same gun voltage.

Next, a series of experiments were conducted to determine the effect of gun voltage on powder deposition and charge to mass ratio (coulombs/kilogram) for silicon powders having a count median aerodynamic diameter (CMAD) of 5.05 $\mu$m and a CMAD of 22.90 $\mu$m. Gun voltages ranging from 0–100,000 volts DC were selected for testing. A fully grounded Nordson aluminum booth was used as a background during the powder spraying. Although the gun was set for a maximum voltage (100 kV), the voltmeter deflection read 75 kV because of the background. The charge acquired per kilogram of particles was determined using a Sheen electrostatic spray diagnostic instrument and a Faraday cup type of arrangement.

As illustrated in FIG. 1D and 1E, the particles were negatively charged. Further, as the gun voltage increased, the charge to mass ratio increased. The optimum gun voltage for obtaining the most uniform depositions was determined to be 75 kV, which was the maximum voltage of the gun with the booth as the background.

A least squares plot of the limiting charge to mass ratios and the experimental values is shown in FIGS. 1D and 1E. As noted by Plot B in both of these figures, the experimental values do not pass through the origin, because the particles were charged triboelectrically as they passed through the gun.

The limiting charge to mass ratio was computed as q/m, wherein: $q/m = 3e_0BE/rd$ and r = particle radius $e_0$ = permittivity of free space ($8.854\times10^{-12}$F.m$^{-1}$)

$e_r$ = relative permittivity of silicon (11.8)

E = electric field strength $B = 1+2(e_r-1)/(e_r+1)$, where B = 2.69 for Si powder d = density of silicon (2440 kg.m$^{-3}$)

In FIG. 1D, the slope of the least square line was computed as $4.32\times10^{-9}$ (Cm/Vkg) and $1.37\times10^{-9}$ (Cm/Vkg) in FIG. 1E. The charge on the 22.90 $\mu$m silicon particles was computed as ($7.72\times10^{-9}$ C/Kg and $4.06\times10^{-5}$ C/Kg on the 5.05 $\mu$m silicon particles. These values were obtained by extrapolation of the least square line. Additionally, the ratio of the calculated charge limit slope to the experimental value slope was calculated as follows:

a) For 22.90 $\mu$m silicon particles, FIG. 1D: $=4.32\times10^{-9}/1.388\times10^{-9}=0.31$; and b) For 5.05 $\mu$m silicon particles, FIG. 1E: $=1.37\times10^{-9}/5.85\times10^{-9}=0.23$.

These results demonstrate that the experimental values are indeed lower than the charge limit values, indicating the relative inefficiency of the corona charging process.

After establishing the electrostatic spray deposition method using the Ransburg Gema gun (Model No.706), efforts were directed towards depositing silicon powder on various substrates. The types of deposition substrates included:

a) semiconducting material (N- and P-doped silicon wafers from MEMC and silicon on insulators, including silicon dioxide and silicon nitride);

b) insulating material (single crystal sapphire wafers from Union Carbide);

c) and conducting material (various metals such as molybdenum from AESAR).

The aerosolized charged silicon powder was deposited onto a cleaned substrate surface. Standard cleaning techniques in the semiconductor industry were utilized. Specifically, on silicon substrates, surface particulates were removed by scrubbing with a Triton X-100 solution (1:100) and an electric toothbrush. The substrates were then immersed in a mixture of $H_2SO_4$ and $H_2O_2$ (7:3) for 10 minutes, and then rinsed with deionized water (DI). These samples were further dipped in a 10% hydrofluoric acid solution for 15 seconds, rinsed with DI water, and blown dry using filtered $N_2$.

Sapphire substrates were scrubbed using an electric toothbrush and a Triton X-100 solution. The substrates were then immersed in a mixture of $H_2SO_4$ and $H_2O_2$ (7:3) for 10 minutes, rinsed with DI water, and dried with filtered $N_2$. It should be noted that molybdenum substrates were not cleaned prior to the deposition of silicon powder.

Uniform silicon powder coatings were achieved using N- and P-doped silicon wafers and silicon on insulators, silicon dioxide and silicon nitride. Conversely, powder deposition was not uniform with single crystal sapphire, as the sapphire did not ground. However, after coating one side of the sapphire wafer with a conductive coating, uniform powder coatings were obtained. These results suggest that use of a grounded metal substrate proximally located to the sapphire facilitates the uniform coating of sapphire. Metal substrates such as molybdenum were also tested, and silicon powder deposited uniformly.

EXAMPLE 2

HEAT TREATMENT OF SILICON COATED SUBSTRATES

Having established a solid phase aerosol deposition process, silicon films were formed by heat treating the silicon coated substrates.

Heat treatment of coated substrates was carried out in a Muffle furnace 26 (Lindberg Corp.), having a maximum heating temperature of 1500° C.. The furnace 26 was adapted for the heat treatment as shown in FIG. IF.

An opening 25 to the furnace 26 was plugged with an ash and sail insulating material 25*a* (Zircar Fibrous Ceramics). A hole was drilled through the center of the insulating material 25*a* to accommodate an alumina process tube 27 which held the sample 28 to be heated. The tube 27 measures 36 inches long and 1.5 inches in diameter. The closed end of the tube 27 containing the sample 28 extends deep inside the furnace 26. The portion of the process tube 27 that is exposed outside of the furnace is enveloped in an insulating material 28'. A removable flange 29 has an opening which attaches to the process tube 27. The flange 29 has two ports 30 and 31.

The port 30 is connected to a gas cylinder 32 containing argon via conduit tubing 33, preferably made of plastic. A pressure regulator 34 regulates the atmospheres of argon flowing into the process tube 27. An open-close valve 35 is connected to the tubing 33, and controls the flow between the pressure regulator 34 and port 30.

The port 31 is connected to a vacuum pump 36 via copper conduit tubing 37. An open-close valve 38 is connected in the conduit tubing 37 controls the flow between the vacuum pump 36 and port 31. The port 30 is connected to the outlet of the open-close valve 35 by conduit 33a, and similarly, copper tubing 37a extends from port 3 to the outlet of the open-close valve 38.

A controller device 40 having presettable control means for regulating operation of the furnace is connected to the furnace via cable wires as at 41.

In operation, for heat treatment of the powder coated substrate, the coated substrate is placed on a holder made of ash material and, in turn, is inserted into the process tube 27. The flange 29 is removed from the process tube 27, and the holder containing the sample 28 is inserted deep inside the interior of the furnace 26.

Prior to heat treatment of a coated substrate, the argon gas supply is shut off by closing its valve 35, and the vacuum pump 36 is turned on so as to remove all traces of air from the process tube 27. The argon gas supply is then turned on, and the vacuum pump 36 is switched on with argon being sucked in. This cycle is repeated. Finally, after 5 minutes of flushing the reactor with argon, valve 35 is closed and argon gas is allowed to flow and remains on throughout the heat treatment of the coated substrate. The flow regulator 34 is adjusted so 1.1 atmospheres of argon flow through the process tube 27 during the heat treatment cycle.

We observed that after heat treatment of various powder coated substrates in 99.998% of argon at different temperatures and times, polycrystalline silicon films formed. As illustrated in FIGS. 2 through 10, the scanning electron microscope (SEM) pictures and x-ray diffraction analysis depict the film formation of silicon on insulating, semiconducting, and conducting substrates. Additionally, a visual analysis, FT-IR spectrophotometer, and a DEKTAK surface profilometer were used to confirm the formation of silicon films.

SEM pictures showing the polycrystalline film formation on sapphire ($Al_2O_3$) substrates is shown in FIGS. 2 through 5. Further, silicon films formed between the temperature ranges of 1000° C. and 1465° C. However, the optimal temperature and time was found to be approximately 1400° C., 12 hours.

Figure 6:
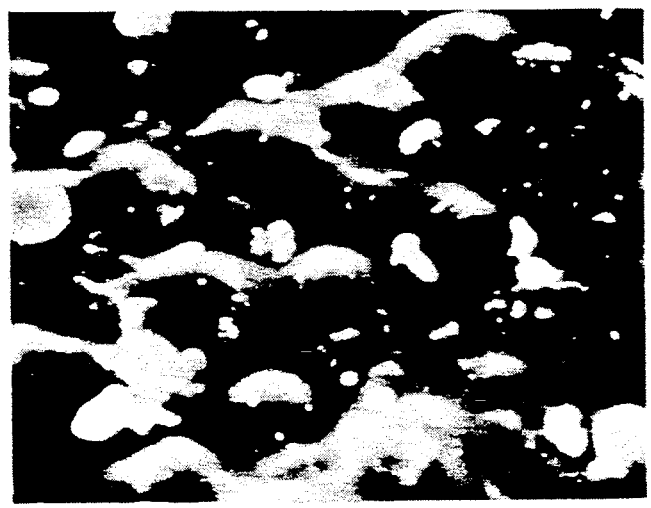
FIG. 6 is a photomicrograph of silicon on silicon at 1300° C., 12 hours, with the substrate coated on the polished side.
Figure 7:
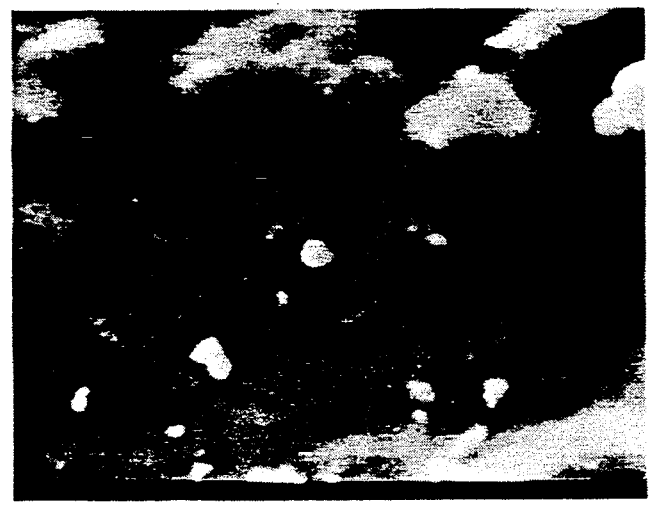
FIG. 7 is a photomicrograph of silicon on silicon at 1300° C., 12 hours, with the substrate coated on the rough side.

FIG. 6 and FIG. 7 illustrate silicon films formed due to CERAC powder deposition on single crystal p-type silicon substrates. The resistivity of these films was computed to be 7 Ω-cm and 1.4 Ω-cm respectively, which was much lower than the bulk resistivity of 2000 Ω-cm. Silicon films formed within the range between 1025° C., 12 hours and 1400° C., 12 hours, with the optimum time and temperature of 1050° C., 21 hours.

Further, these films exhibited a wavy structure. This type of film formation is typical when a recrystallization process has occurred. It was further observed that silicon which coated on the rough side of the silicon substrate yielded a substantially smoother film than the substrates which coated on the polished side. It appears that the rough side provides more nucleation sites for the deposited silicon to bind, thereby enhancing film growth.

Figure 7A:
FIG. 7A is a photomicrograph of silicon deposited on LPCVD silicon dioxide at 1100° C., 6 hours.
Figure 7B:
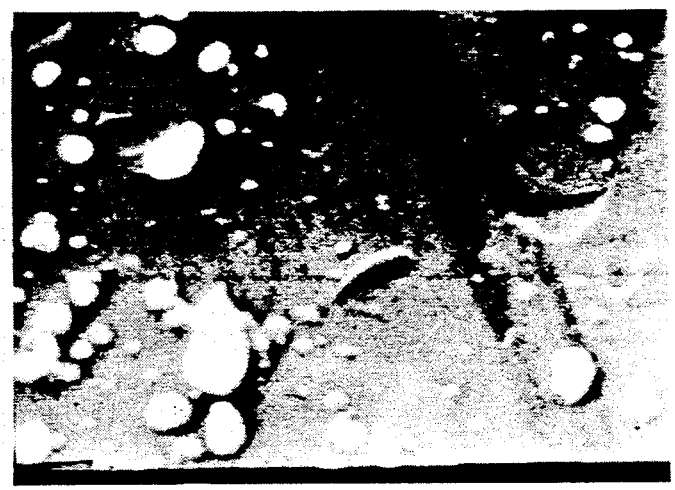
FIG. 7B is a photomicrograph of silicon deposited on LPCVD silicon dioxide at 1100° C., 12 hours.

FIGS. 7A and 7B depict the formation of silicon film on a silicon substrate, wherein the substrate was first coated with silicon dioxide followed by a top coat layer of silicon powder. These figures further illustrate the structural differences in the films due to variations in heating times. As shown in FIG. 7A, after 6 hours of heating at 1100° C., the silicon film exhibited crater formation. However, with additional heating (12 hours), a smoother silicon film developed (see FIG. 7B).

FIG. 7C illustrates the x-ray powder diffraction patterns obtained with silicon powder deposited on a silicon substrate with a layer of silicon nitride deposited in between. The formation of silicon film is depicted in the figure by the three peaks represented by peaks C, C', and C''.

Figure 8:
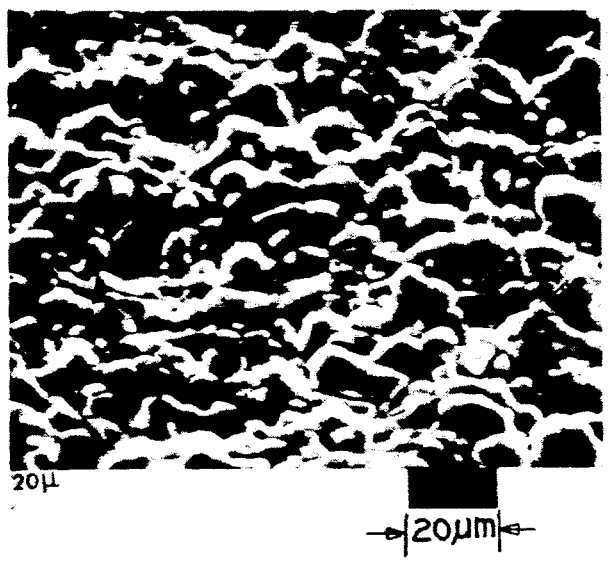
FIG. 8 is a photomicrograph of silicon on molybdenum at C, 12 hours.

FIG. 8 illustrates silicon film formation on molybdenum substrate. The film showed a resistivity of 18 micro ohm-cm, and has strong potential as electrical contacts. Silicon films formed between the temperature ranges of 1000° C., 12 hrs. and 1465° C., 12 hrs. The optimum temperature and time is 1430° C., 12 hrs.

Figure 9:
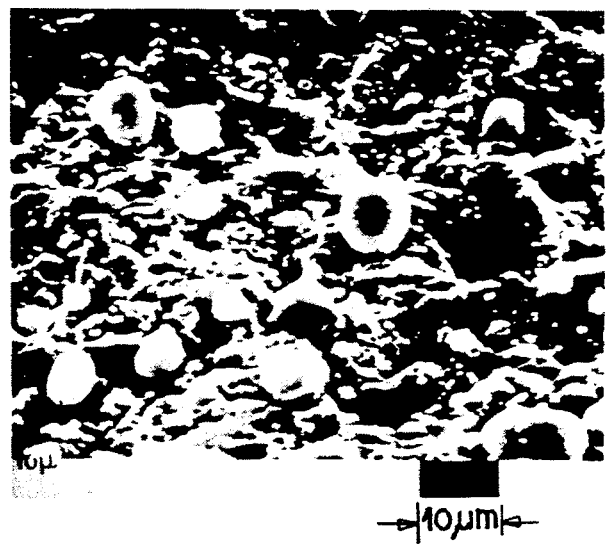
FIG. 9 is a photomicrograph of nonuniform powder deposit of silicon on sapphire at 1435° C., 12 hours with ramp down at 2° C./min.
Figure 10:
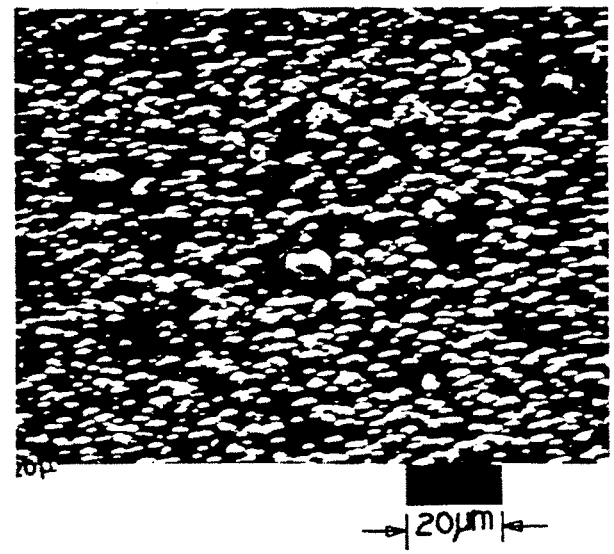
FIG. 10 is a photomicrograph of normal powder deposit of silicon on sapphire at 1435° C., 12 hours with ramp down at 2° C./min.

FIG. 9 and FIG. 10 emphasize the importance of uniform powder coating on substrates. In particular, these figures illustrate the differences between a heat treated film formed from a uniformly deposited aerosol sample (FIG. 10) and one on which powder was initially deposited evenly, but was subsequently blown off to create a non-uniform green body (FIG. 9). The latter film also exhibited craters and major gaps.

After heating the powder coated substrates at various times, it was further observed that not all the powder forms silicon film, but remains as loose powder on top of the film. This occurs because the powder, which is in thermal contact with the substrate, heats first, resulting in the subsequent film formation from the bottom and propagating upwards. These results demonstrate that film thickness can be controlled by varying the length of time that the powder coated substrate is heated. It should be noted that following heat treatment of the sample, the loose powder was blown off.

In addition, as the process tube containing the sample is cooled or heated between 600° C. and 900° C., it is important that the heating or cooling rate remain at 2° C./min. or below. However, as the sample is cooled from the highest processing temperature down to 900° C., the cooling rate or ramp down should be maintained at 3° C./min. or less. Further, when cooling from 600° C. to room temperature, the sample should be cooled at the rate of 3° C./min.

While minor modifications might be suggested by those versed in the art, it should be understood that we wish to embody all such modifications in the patent warranted hereon as may be justified by our contribution to the art.

We claim:

1. A method for the deposition of silicon and the formation of a silicon film on substrates, comprising the steps of:
   a) aerosolizing and electrostatically charging silicon powder particles with electrostatic charges of one polarity;
   b) grounding a substrate to provide an opposite polarity on the substrate;
   c) coating the charged particles of silicon powder on the substrate to form a powder coated substrate; and
   d) thereafter heat treating the coated substrate to form a silicon film on the substrate.

2. The method of claim 1, wherein said substrates are selected from the group consisting of semiconducting, insulating, and conducting materials.

3. The method of claim 2, wherein said semiconducting material is silicon.

4. The method of claim 3, wherein said silicon is n-doped.

5. The method of claim 3, wherein said silicon is p-doped.

6. The method of claim 2, wherein said insulating material is sapphire.

7. The method of claim 2, wherein said conducting material is molybdenum.

8. The method of claim 1, wherein the heat treatment of the coated substrate is conducted in an atmosphere of flowing argon.

9. The method of claim 1, wherein heat treating the powder coated substrate in step d) is conducted for approximately 1-24 hours and between the temperatures of approximately 1000° C. and 1430° C. to melt the powder and form a silicon film.

10. The method of claim 1, wherein the silicon film produced is polycrystalline.

11. The method of claim wherein the thickness of the deposition of the silicon powder in step c) is controlled by the length of time of step c), the velocity of the coating of step c), and the electrostatic charge level differential between the particles and the substrate.

12. The method of claim 1, wherein the charged particles travel approximately 17 cm to the substrate.

13. The method of claim 11, wherein the length of the spray time for the deposition of the silicon powder particles ranges between approximately 1-3 seconds.

14. The method of claim 11, wherein the velocity of the coating of step c) is approximately 11.2 $Nm^3/hr$.

15. The method of claim 11, wherein the electrostatic charge level ranges between 0 and 100,000 volts DC.

16. The method of claim 15, wherein the electrostatic charge level is 75 kV.

17. The method of claim 1, wherein the silicon powder is particulate in a $-325$ mesh size range.

18. The method of claim 1, wherein the substrate is sapphire and wherein there at treating step d) is 1400° C., 12 hours.

19. The method of claim 1, wherein the substrate is silicon and wherein the heat treating step d) is 1050° C., 21 hours.

20. The method of claim 1, wherein he substrate is molybdenum and wherein the heat treating step d) is 1430° C. 12 hours.

21. The method of claim 1, wherein the substrate is silicon dioxide on silicon and wherein the heat treating sep d) is 1100° C., 6-12 hours.

22. The method of claim 1, wherein the substrate is silicon nitride on silicon and wherein the heat trating step d) is 1025° C., 12 hours.

* * * * *

UNITED STATES PATENT AND TRADEMARK OFFICE
CERTIFICATE OF CORRECTION

PATENT NO. : 5,075,257

DATED : December 24, 1991

INVENTOR(S) : Hawk et al

It is certified that error appears in the above-identified patent and that said Letters Patent is hereby corrected as shown below:

Column 1, line 39, "he" change to read --the--,
         line 49, "cornoa" change to read --corona--,
         line 50, "electrosatically" change to read --electrostatically--,
         line 61, "he" change to read --the--,
         line 62, "supplies" change to read --supplied--,
         line 67, "e" change to read --be--.

Column 2, line 36, "C, 12 hours" change to read --1430°C, 12 hours--.

Column 3, line 12, "wa" change to read --was--,

Column 4, line 17, "charge" change to read --charge 17.--,
         lines 43-44, "angled" change to read --ranged--.

Column 7, line 4, "3" change to read --31--.

Column 10, claim 18, line 10, "there at" change to read --the heat--,
         claim 22, line 22, "trating" change to read --treating--.

Signed and Sealed this

Fourteenth Day of December, 1993

Attest:

BRUCE LEHMAN

*Attesting Officer*      *Commissioner of Patents and Trademarks*